United States Patent [19]

Takagi

[11] Patent Number: 4,996,553
[45] Date of Patent: Feb. 26, 1991

[54] METHOD FOR PRODUCING GLOSS IMAGE ON IMAGE RECORDING MEDIUM AND APPARATUS FOR MAKING THE GLOSS IMAGE ON THE MEDIUM

[75] Inventor: Osamu Takagi, Nagoya, Japan

[73] Assignee: Brother Kogyo Kabushiki Kaisha, Japan

[21] Appl. No.: 398,979

[22] Filed: Aug. 28, 1989

[30] Foreign Application Priority Data

Aug. 31, 1988 [JP] Japan ................................. 63-217486

[51] Int. Cl.$^5$ ...................... G03B 27/32; G03B 27/52
[52] U.S. Cl. ........................................ 355/27; 355/77; 355/132
[58] Field of Search ....................... 355/32, 27, 77, 132, 355/133; 430/138; 354/299, 302, 354

[56] References Cited

U.S. PATENT DOCUMENTS

| | | | |
|---|---|---|---|
| 4,305,768 | 12/1981 | Lontz | 355/32 X |
| 4,357,102 | 11/1982 | Taren et al. | 355/77 |
| 4,639,405 | 1/1987 | Franke | 355/290 X |

Primary Examiner—Richard A. Wintercorn
Attorney, Agent, or Firm—Oliff & Berridge

[57] ABSTRACT

An image recording apparatus having an exposure unit, pressure developing unit and a thermal fixing unit. The thermal fixing unit serves as an apparatus for forming a glossy output image provided on an image recording medium such as a developer sheet. The glossy image forming means includes a heating means, a pressure contact means and cooling means. The developer sheet passes through the heating means and the thus heated developer sheet is travelled along a pressure contact means. During this travel, the sheet is cooled by the cooling means.

8 Claims, 2 Drawing Sheets

4,996,553

METHOD FOR PRODUCING GLOSS IMAGE ON IMAGE RECORDING MEDIUM AND APPARATUS FOR MAKING THE GLOSS IMAGE ON THE MEDIUM

BACKGROUND OF THE INVENTION

The present invention relates to a method for producing a gloss image on an image recording medium and an apparatus for making the gloss image on the image recording medium.

In one conventional image recording apparatus, a recording medium is of transfer type recording medium such as a photosensitive sheet which comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. The developer sheet includes a base substrate, the developer material layer and a surface resin layer. Such image recording medium is disclosed in, for example, U.S. Pat. No. 4,399,209 and Japanese Patent Application Kokai No. 58-88739.

As is well know, the image recording apparatus of this type irradiates light onto an original and a light reflected from the original or transmitted therethrough passes through an optical system such as a reflection mirror, a filter and lenses, and is focused on the photosensitive recording medium at an exposure unit. As a result, a latent image is formed on the photosensitive recording medium upon photocuring the light exposed microcapsules. Then the light-exposed photosensitive recording medium is superposed with a developer sheet, and these sheets are pressed together at a pressure developing unit, so tha non photo-cured microcapsules are reptured to react the chromogenic material with the developer material, to thereby provide an output image on the developer sheet. After the pressure developing operation, the developer sheet is delivered to a thermal fixing unit where the output image is thermally fixed and an output image is obtained.

In another type of an image recording medium, a self-contained type has been known in which the encapsulated chromogenic material or dye precursor and the developer material are codeposited on one surface of a single substrate as one layer or as two contiguous layers. The self contained type is disclosed in U.S. Pat No. 4,440,846. In the transfer type, the single sheet is subjected to light irradiation and pressure developing operations to obtain the output image thereon.

SUMMARY OF THE INVENTION

Through inhouse R & D activities, has been proposed a method for obtaining a glossy image on the image recording medium. In the method, a heat roller is used for pressurizingly heating the developer medium so that a surface temperature at the medium becomes about 100° C. By this, chromogenic reaction between the first and second materials is promoted, and surface of the medium becomes mirror like surface to thus produce glossy image thereon.

However, with such method, fine temperature control is required for maintaining the surface temperature around 100°C. It the temperature exceeds 100° C., the output image may be adhered onto the pressure member such as the heat/pressure roller. On the other hand, if the temperature is less than the temperature, no glossy image is obtainable.

Further, processing period may be prolonged, since it takes about 2 seconds for heating and pressurizing the recording medium in order to obtain highly glossy image.

It is therefore, an object of the present invention to provide an improved method and apparatus for forming a glossy output image on an image recording medium, which method and apparatus are capable of facilitating temperature control within a shortened period.

These and other objects of the invention will be attained by providing a method for forming a glossy output image on an image recording medium, the image recording medium having one surface carrying an output image, the method comprising the steps of: heating and pressing the image recording medium by means of a pressure contact member for meltingly smoothening the one surface of the image recording medium, cooling the one surface during travel of the image recording medium while maintaining a surface contact between the pressure application member and the image recording medium, and separating the image recording medium from the pressure contact member.

In another aspect of the invention, there is provided An apparatus for forming a glossy output image on an image recording medium, the image recording medium having one surface carrying an output image, comprising: a pressure contact member in pressure contact with the one surface of the image recording medium, heating means for heating one of the pressure contact means and the image recording medium; and cooling means disposed at downstream of the heating means for cooling the pressure contact means and the image recording medium.

The developer material carried on the image recording medium such as a developer sheet is melted by the heating step. In this heating step, the temperature is not severely restricted into 100° C., and the medium is heated within a short time. The thus heated developer medium is cooled by the cooling means while maintaining surface contact with the pressure contact member. During this cooling step, the developer material is rapidly solidified. Thereafter, the image recording medium is separated from the pressure contact member. In this separating step, the surface of the image recording medium becomes smoothened because of the surface conformance with the pressure contact member. Further, the medium can be easily separated from the pressure contact member, since the surface has been already solidified.

DETAILED DESCRIPTION OF THE PREFERRED EMBODIMENTS

Figure 1:
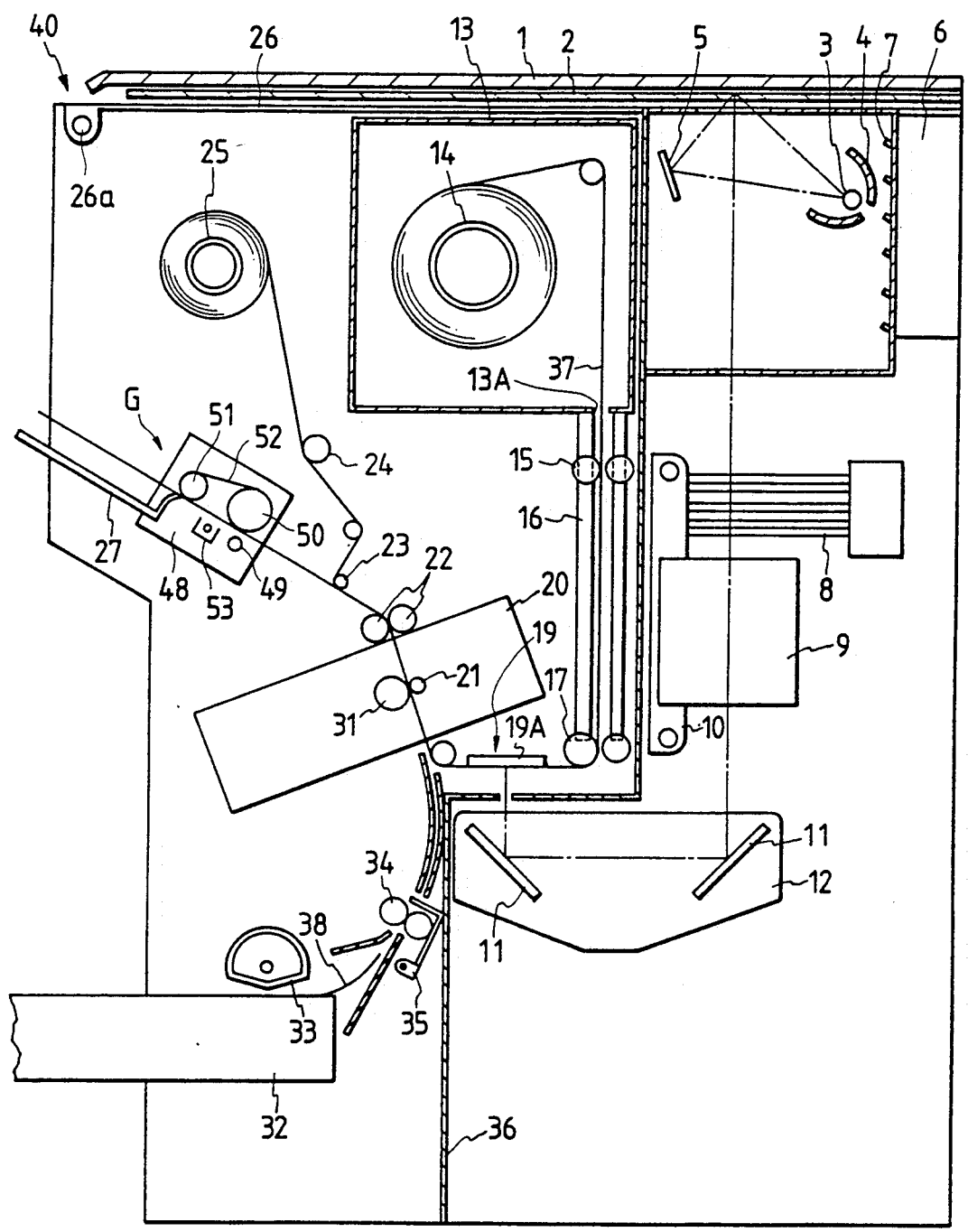
FIG. 1 is a schematic cross-sectional side view showing an image recording apparatus incorporating an apparatus for making a glossy output image on an image recording medium according to this invention.

FIG. 1 shows a copying machine capable of performing a full-color copying. This copying machine employs the above-described transfer type image recording mediums including a microcapsule sheet 37 and a developer sheet 38.

As shown in FIG. 1, the copying machine 40 generally includes an exposure unit 19 having an exposure stand 19A and a pressure developing unit 20. Further, a light shielding cover plate 36 is disposed in the apparatus to spacedly divide the apparatus into an optical system and other requisite units. The elongated weblike microcapsule sheet 37 is wound around a cartridge shaft 14, and is retained in a microcapsule sheet cartridge 13 that is detachably disposed at a position immediately below an original support stand glass 2 and is formed with a bottom opening 13A. In other words, the cartridge 13 storing therein non light exposed microcapsule sheet 37 is positioned at an upper portion of the apparatus 40. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed roller 15 and a barrel roller 17 are rotatably provided at a vertical sheet path for guide travel of the sheet toward the exposure unit. At the downstream side of the exposure unit 19, there is provided the pressure developing unit 20 which includes a small diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and a resist-gate 35 are provided so as to align leading edge of the developer sheet 38.

At downstream side of the pressure developing unit 20, a pair of feed rollers 22 are provided so as to provide constant running speed of the microcapsule sheet 37. This speed is coincident with a horizontally moving speed of the original support stand glass 2.

At downstream side of the feed rollers 22, a separation roller unit 23 which provides a meandering sheet path is provided at which the microcapsule sheet 37 is separated from the developer sheet 38. The separate microcapsule sheet 37 is taken-up by the above mentioned take up means 25 through a meander travel control roller 24.

A thermal fixing unit is provided at the downstream side of the separation roller 23 for thermally fixing an output image provided on the developer sheet 38. The thermal fixing unit serves as a gloss image forming unit G according to the present invention. Further, a discharge tray 27 is provided at downstream side of the glossy image forming unit G.

As shown in FIG. 1, the copying machine 40 has its top plate portion provided with a stand cover 1 and the original support stand glass 2. The original support stand glass 2 is formed of light transmissive material and is movable in the horizontal direction and on which a desired original (not shown) is to be placed. Further, an inner cover 26 is hingedly supported to a main frame as at 26a. At the upper one side section (right side in FIG. 1) of the copying machine 40, fixedly provided is a light source including a linear halogen lamp 3 extending in the direction perpendicular to the moving direction of the original support stand glass 2, and a semi-cylindrical reflector 4 disposed to surround the lamp 3. Further, additional reflector 5 is disposed in confrontation with the lamp 3 so as to reflectingly direct light toward the original, which light has not been initially directed toward the original. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leakage out of the apparatus.

At another side of the halogen lamp 3 there are provided a fan 6 and a louver 7 for introducing an external air into the apparatus. Accordingly, air is effectively impinged onto the light source 3 and the original support stand glass 2 to cool the same.

A filter unit 8 is disposed below the original support stand glass 2. Further, a lens unit 9 is provided below the filter unit 8. Light emitted from the halogen lamp 3 and reflected at the original placed on the original support stand glass 2 passes through the filter unit 8 and enters the lens 9. The filter unit 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable. A pair of reflection mirrors 11 and 11 are provided below the lens 9. The condensed lights passing through the lens 9 change their direction by 180 degrees (completely reverse direction) by the two reflection mirrors 11 and the thus oriented lights impinge on the microcapsule sheet 37 closely contacting the bottom of the exposure table 19A to form the latent image thereon. The two reflection mirrors 11 are securely mounted to a mirror mounting plate 12, so that the adjustment of the length of the light path and focusing adjustment can be effected by fine adjustment of the position of the mirror mounting plate 12.

Figure 2:
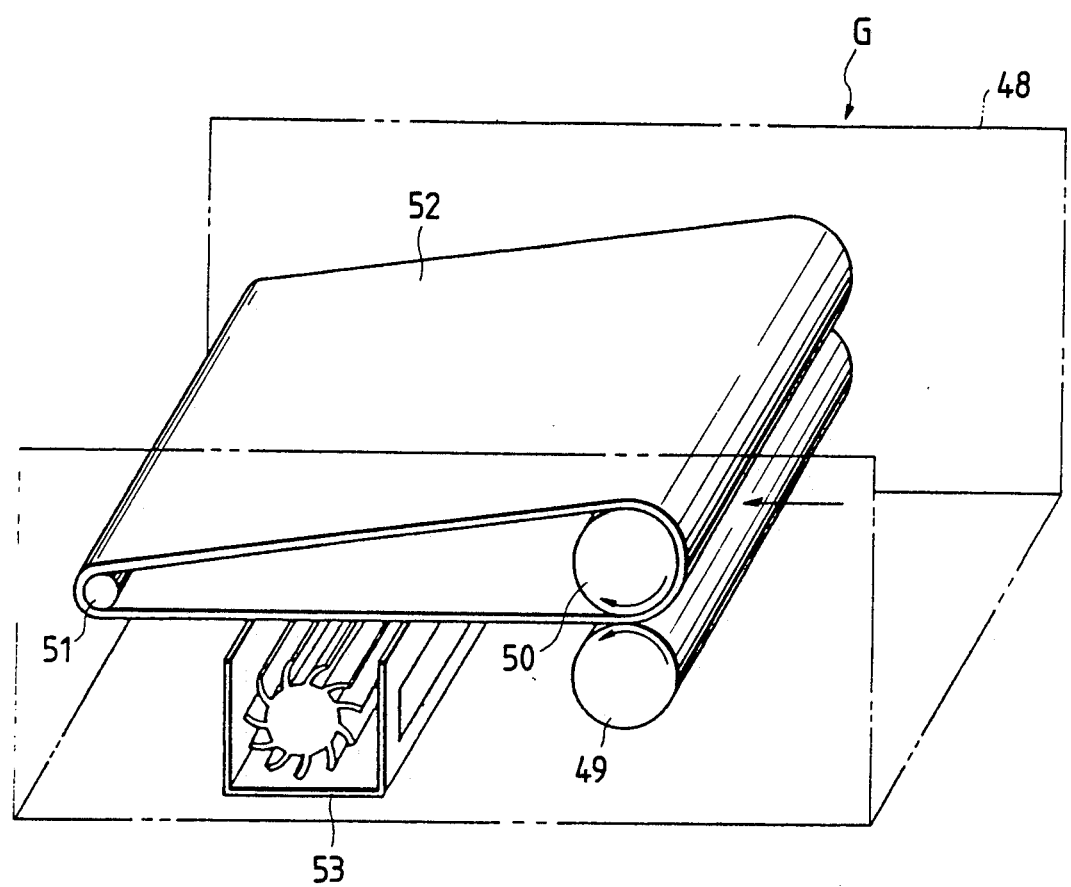
FIG. 2 is a perspective view showing the apparatus for making the glossy output image on the image recording medium according to the present invention.

The glossy image forming unit G will be described in detail with reference to FIGS. 1 and 2.

The glossy image forming unit G includes an outer frame 48 which rotatably supports a heat roller 49. The heat roller 49 accommodates therein a heater (not shown), and is rotatably about its axis in one direction (counterclockwise direction in FIG. 2). Further, a pressure roller 50 is also rotatably supported to the frame 48 at a position above the heat roller 49. The pressure roller 50 is urged toward the heat roller 49 by a spring (not shown).

A separation roller 51 having a diameter smaller than that of the pressure roller 50 is rotatably supported by the frame 48 at a position spaced away from the pressure roller 51. Further, an endless belt 52 is mounted between the pressure roller 50 and the separation roller 51. The endless belt 52 has a smoothened surface and is driven at a speed equal to a peripheral rotation speed of the heat roller 49. The endless belt 52 is formed of silicone rubber or a polyethylene terephthalate coated with a removing agent such as a silicon. Below the endless belt 52, a cooling fan 53 is provided so as to cool the smoothened surface of the belt 52.

Operation of the copying apparatus will be described:

The microcapsule sheet 37 taken out through the opening 13A of the cartridge 13 is fed by the feed rollers 15 and guided by the barrel roller 17. The sheet 37 then passes in contact with a lower face of the exposure table 19A where original image carrying light is applied to the sheet 37, so that a latent image is formed on the sheet 37.

More specifically, the original support stand cover 1 is lifted up for mounting the original on the original support stand glass 2. Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is comming into confrontation with the light source. Thereafter, with the halogen lamp 3 being lighted, the original support stand glass 2 is then moved in a second direction (leftwardly in FIG. 1) opposite to the first direction. The light emitted from the halogen lamp 3 is reflected at the original, and the reflected light passes through the filter unit 8 and lens 9 and is reflected at two reflection mirrors 11. The last reflected light is finally directed toward the microcapsule sheet 37 which is located under the exposure table 19A to form the latent image on the sheet 37. At this time, since the microcapsule sheet 37 is moved under the exposure table 19A in the second direction (leftwardly in FIG. 1) at the same speed as the moving speed of the original support stand glass 2, the latent image corresponding to the original image is formed on the microcapsule sheet 37. Since the conveying speed for the microcapsule sheet 37 is controlled to be constant by feed rollers 22 and is set equal to the moving speed of the original support stand glass 2, line latent images having given widths are sequentially formed on the microcapsule sheet 37 that is passing along the lower surface of the exposure table 19A.

The sheet is then fed to the pressure developing unit 20 by the guide roller 17. At the pressure developing unit, the sheet 37 is pressurizingly superposed with the developer sheet 38. An unexposed portion of the microcapsule sheet 37 leaving the cartridge 13 is kept unexposed to light by the shielding cover 36. The developer sheet 38 are fed out one by one by the sector roller 33, and each sheet 38 is fed to a sheet inlet of the pressure developing unit 20 after leading edge of the sheet 38 is aligned by developer sheet roller 34 and the resist gate 35, Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

In summary, in timed relation with the movement of the original support stand glass 2 in the second direction, the sector roller 33 feeds out the developer sheets 38 one by one from the developer sheet cassette 32. The developer sheet 37 superposed on the light-exposed microcapsule sheet 37 is fed to the pressure developing unit 20, and the latent image on the microcapsule sheet 37 is developed and transferred onto the developer sheet 38.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to heating for glossy image production in the glossy image forming unit G and is then discharged onto the discharge tray 27. Meanwhile, the microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 1) of the glass 2 confronts the light source, the copying of the original is completed and the halogen lamp 3 is turned off.

In the gloss image processing at the glossy image forming unit G, the developer sheet 38 enters between the heat roller 49 and the pressure roller 50 with the output image facing upwardly. That is, the output image is in confrontation with the smoothened surface of the endless belt 52. The belt has a surface temperature ranging from 100° C. to 150° C., and therefore, the developer sheet 38 is heated and pressurzied. In this instance, since the developer material initially has a low viscosity, the developer material layer is in intimate contact with the smoothened surface of the belt 52. Accordingly, the developer sheet surface becomes flat or smooth in conformance with the smoothened surface of the belt 52.

Only one second is required for heating and pressurizing the developer sheet. However, if the developer sheet 38 is promptly separated from the belt 52, the output image on the developer sheet may be transferred onto the belt surface. This is due to the low viscosity at the output image zone. Taking this into consideration, in the glossy image forming unit of the present invention, maintained is the surface contact between the developer sheet and the endless bend 52 until the developer sheet 38 reaches the separation roller 51. During travel of the developer sheet from the heat roller 49 to the separation roller 51 and along the belt 52, the developer sheet 38 is cooled by the cooling fan 53 in order to enhance viscosity of the imaging region of the developer sheet. When the developer sheet reaches the small diameter separation roller 51, the sheet 38 is separated from the belt 52 because of the linear orientation of the sheet 38. At this time, the viscosity of the imaging region is sufficiently high, and therefore, no image transfer onto the belt 52 occurs.

The present invention is not limited to the above described embodiment, but various changes and modifications can be made. For example, other type of pressure application member is employable instead of the pressure member such as the pressure roller 50 and the endless belt 52. Further, the heating member such as the heat roller 49 can be dispensed with, and instead, a heating element can be incorporated into the pressure roller 50. Furthermore, other type of cooling means can be used instead of the cooling fan 53.

In view of the foregoing, according to the present invention, gloss surface processing can be achieved by the simplified construction, and no fine temperature control is required. Further, heating can be made within a limited time period. Therefore, the glossy treatment can be made regardless of the change in ambient atmosphere, and high speed processing is achievable.

While the invention has been described in detail and with reference to specific embodiment, it would be apparent for those skilled in the art that various changes and modifications can be made therein without departing from the spirit and scope of the invention.

What is claimed is:

1. A method for forming a glossy output image on an image recording medium, the image recording medium having one surface carrying an output image, the method comprising the steps of:
   heating and pressing the image recording medium by means of a pressure contact member for meltingly smoothening the one surface of the image recording medium;
   cooling the one surface during travel of the image recording medium while maintaining a surface contact between the pressure contact member and the image recording medium; and
   separating the image recording medium from the pressure contact member.

2. A method of forming a glossy output image on an image recording medium, the image recording medium having one surface carrying an output image, the method comprising the steps of:
   heating and pressing the image recording medium by means of a pressure contact member for meltingly smoothening the one surface of the image recording medium;
   cooling the one surface during travel of the image recording medium while maintaining a surface contact between the pressure contact member and the image recording medium; and
   separating the image recording medium form the pressure contact member;
   wherein the image recording medium comprises a developer medium having a developer material layer, the developer material layer being melted at the heating step.

3. An apparatus for forming a glossy output image on an image recording medium, the image recording medium having one surface carrying an output image, the apparatus comprising:
   a pressure contact member in pressure contact with the one surface of the image recording medium, the pressure contact member defining a sheet path along which the image recording medium travels;
   heating means for heating one of the pressure contact member and the image recording medium;
   cooling means disposed downstream of the heating means with respect to the sheet path and confronting the pressure contact member for cooling the pressure contact member and the image recording medium while maintaining the pressure contact.

4. The apparatus as claimed in claim 3, wherein the heating means is disposed within the pressure contact means.

5. The apparatus as claimed in claim 3, wherein the heating means is positioned adjacent the pressure contact means.

6. The apparatus as claimed in claim 3, wherein the image recording medium travels at a predetermined travelling speed, and wherein the pressure contact means comprises an endless belt which defines a sheet path along which the image recording medium travels, the endless belt being driven at a speed equal to the predetermined speed of the image recording medium, the heating means being positioned at an upstream portion in the sheet path for initially melting the one surface of the image recording medium, and the cooling means being positioned at a downstream portion in the sheet path.

7. The apparatus as claimed in claim 3, comprising:
   a separation means positioned in said sheet path for separating said recording medium from said pressure contact means.

8. The apparatus as claimed in claim 6, comprising:
   a separation means positioned in said sheet path for separating said image recording medium from said endless belt;
   said separation means comprising a roller over which said belt is entrained, said roller having diameter to effect such separation.

* * * * *